United States Patent
Knotter et al.

(10) Patent No.: US 6,392,417 B1
(45) Date of Patent: May 21, 2002

(54) ARRANGEMENT AND METHOD FOR DETECTING THE END OF LIFE OF AN AQUEOUS BATH UTILIZED IN SEMICONDUCTOR PROCESSING

(75) Inventors: Dirk Maarten Knotter, Eindhoven; Leonardus Cornelus Robertus Winters; Servatius Maria Vleeshouwers, both of Nijmegen, all of (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/658,932

(22) Filed: Sep. 11, 2000

(30) Foreign Application Priority Data

Sep. 10, 1999 (EP) .............................. 99202951

(51) Int. Cl.⁷ ................... G01N 27/02; G01N 27/00; G01N 27/26; B08B 6/00; B08B 3/00
(52) U.S. Cl. ................ 324/439; 324/71.1; 134/1.3; 134/18; 134/2; 134/100.1; 204/406; 204/409; 204/410; 204/411
(58) Field of Search .............. 134/1.3, 18, 2, 134/100.1; 422/82.13, 63; 204/406, 409, 410, 411; 324/439, 71.1

(56) References Cited

U.S. PATENT DOCUMENTS

| | | | | |
|---|---|---|---|---|
| 3,902,970 A | * | 9/1975 | Levin ........................ 205/778 |
| 4,170,520 A | * | 10/1979 | Weaver ..................... 435/287.1 |
| 4,525,265 A | * | 6/1985 | Abe et al. .................. 204/415 |
| 4,714,673 A | * | 12/1987 | Kessler et al. .............. 435/14 |
| 5,081,045 A | * | 1/1992 | McGill ...................... 436/135 |
| 5,223,222 A | * | 6/1993 | Ricchio et al. .............. 422/63 |
| 5,364,510 A | | 11/1994 | Carpio ....................... 134/8 |
| 5,439,569 A | | 8/1995 | Carpio ....................... 134/1.3 |
| 5,472,516 A | | 12/1995 | Hanson et al. ............... 134/18 |
| 5,954,885 A | * | 9/1999 | Ohmi ......................... 134/1.3 |
| 6,153,014 A | * | 11/2000 | Song |
| 6,171,975 B1 | * | 1/2001 | Hase et al. ................. 438/745 |
| 6,261,845 B1 | * | 7/2001 | Verhaverbeke et al. ....... 436/55 |
| 6,273,098 B1 | * | 8/2001 | Wong ......................... 134/1.3 |
| 6,286,526 B1 | * | 9/2001 | Hase et al. ................. 134/100.1 |

FOREIGN PATENT DOCUMENTS

| | | |
|---|---|---|
| JP | 817775 | 1/1996 |
| JP | 7142435 A | 6/1998 |
| JP | 10326769 | 12/1998 |

* cited by examiner

*Primary Examiner*—Safet Metjahic
*Assistant Examiner*—Wasseem H. Hamdan
(74) *Attorney, Agent, or Firm*—Aaron Waxler

(57) ABSTRACT

Arrangement and method for detecting the end of life of an aqueous bath utilized in semiconductor processing, the bath containing water, an amount of hydrogen peroxide and an amount of a predetermined chemical species, which is either an acid or a base, in accordance with the following steps: adding a predetermined additional amount of the hydrogen peroxide and/or the predetermined chemical species at predetermined time intervals, measuring at least one parameter of the aqueous bath, thereby obtaining a measured parameter value, the at least one parameter being selected from a set of parameters including bath pH and bath conductivity; reading a predicted value of said at least one parameter from a memory storing a curve of predicted values of said at least one parameter as a function of time, said curve depending on said predetermined additional amount of said hydrogen peroxide and/or said predetermined chemical species, and depending on said predetermined time intervals; establishing the end of life of said aqueous bath on the basis of a predetermined deviation between said measured parameter value and said predicted value.

13 Claims, 1 Drawing Sheet

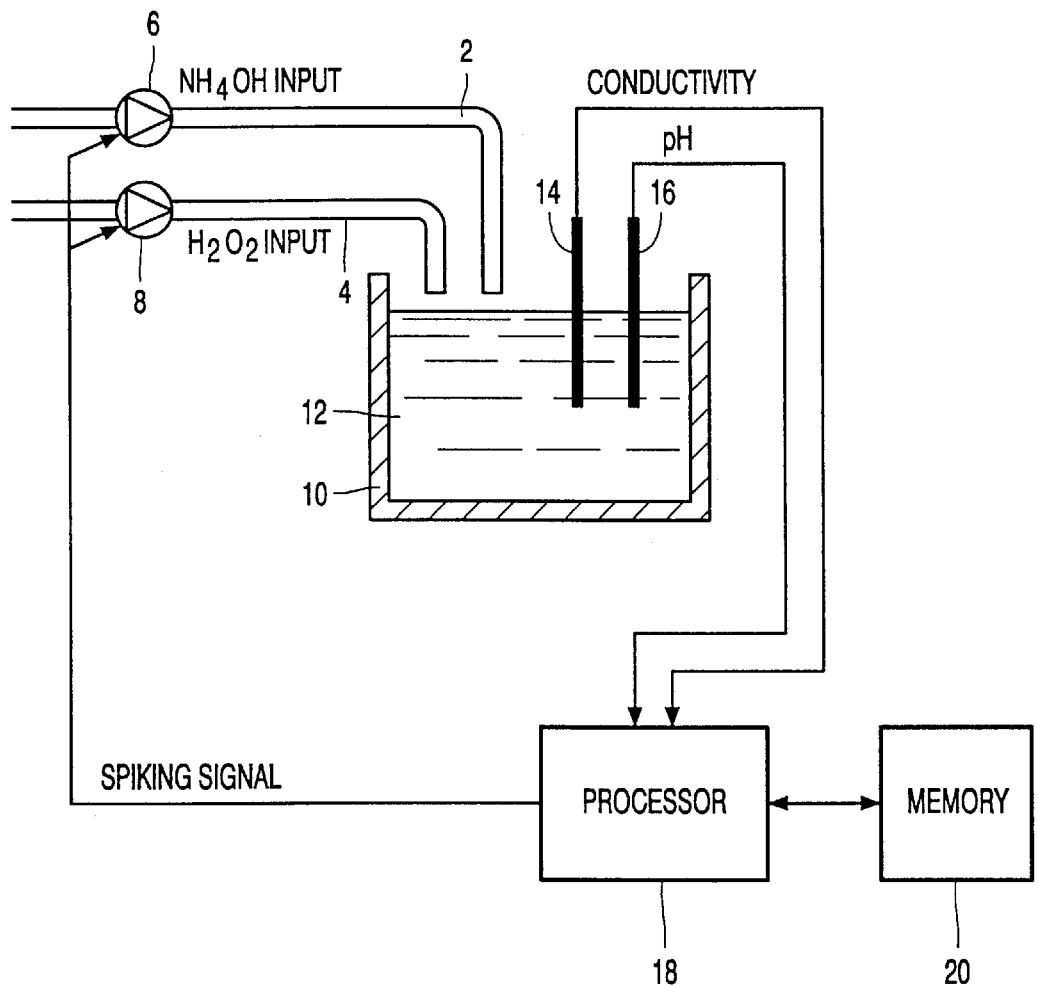

ARRANGEMENT AND METHOD FOR DETECTING THE END OF LIFE OF AN AQUEOUS BATH UTILIZED IN SEMICONDUCTOR PROCESSING

BACKGROUND OF THE INVENTION

The present invention relates to an arrangement for detecting the end of life of an aqueous bath utilized in semiconductor processing, comprising water, an amount of hydrogen peroxide and an amount of a predetermined chemical species, the species being either an acid or a base.

During manufacturing substrates, especially semiconductor substrates, impurities need to be removed from the substrate surface. One well-known technique is to rinse the substrate surface in an aqueous bath containing water, an amount of hydrogen peroxide and an amount of a chemical species. A solution called "SC1" frequently used for cleaning comprises ammonium hydroxide as such a chemical species.

As, for instance, summarized in the introduction to U.S. Pat. No. 5,472,516, such rinsing may be carried out using many different techniques, such as immersion in a bath, spray cleaning and megasonic cleaning. However, a small variation in the amount of either ammonium hydroxide or hydrogen peroxide will negatively affect the cleaning efficiency of the aqueous bath.

In commonly used cleaning solutions, the ammonium hydroxide concentration is about 0.01 to about 10% by weight of the cleaning solution, and the hydrogen peroxide concentration is about 0.01 to about 10% by weight of the cleaning solution.

Both the concentration of ammonium hydroxide and the concentration of hydrogen peroxide tend to vary substantially over time. The ammonium hydroxide can evaporate spontaneously from the solution whereas hydrogen peroxide decomposes.

Because exchanging an aqueous bath for a fresh aqueous bath results in high costs, and a premature exchange results in too much chemical disposal, there is a strong need to keep the concentrations of both ammonium hydroxide and hydrogen peroxide within desired ranges as long as possible.

One solution to that problem is called "spiking". The technique of "spiking" is e.g. referred to in JP-A-07142435. This patent document proposes to control the concentration of ammonium hydroxide within a range of 2.0 to 3.5 wt. % by adding a predetermined quantity of aqueous solution of ammonium hydroxide at predetermined time intervals. The predetermined time intervals are equal to the time elapsed before the concentration of ammonium hydroxide has decreased from 3.5 wt. % to 2.0 wt. % and the predetermined quantity is equal to the quantity required for increasing the concentration of ammonium hydroxide from 2.0 wt. % to 3.5 wt. %.

U.S. Pat. No. 5,439,569 proposes to improve the technique of "spiking". This document notes: "In order to manufacture even smaller submicron semiconductor devices, as well as improving the manufacturing yield, it is imperative that ultimated schemes for maintaining a tighter control on the chemical make-up of a liquid processing bath is desired." Therefore this document proposes to continually monitor and, if necessary, appropriately adjust the concentration level of chemicals in an aqueous bath automatically. To this end, samples of the aqueous bath are continuously taken and processed by electrochemical sensors to determine the concentrations of the chemical species within the aqueous bath. The electrochemical sensors are used in a feedback loop such that the chemical species are added to the aqueous bath if the controlled parameters deviate too much from a desired value. End of life issues regarding the aqueous bath are not considered in this document.

In U.S. Pat. No. 5,472,516, referred to above, a similar approach as in U.S. Pat. No. 5,439,569 is taken. In U.S. Pat. No. 5,472,516 it is proposed to measure the pH of the cleaning solution in the aqueous bath, which is demonstrated to be a good indication of the concentration of hydrogen peroxide present in the solution, and to measure the conductivity of the cleaning solution, which is demonstrated to be a good measure of the concentration of ammonium hydroxide in the cleaning solution. In dependence on the pH and the conductivity measured, the arrangement adds hydrogen peroxide and/or ammonium hydroxide to the cleaning solution to maintain their concentrations within desired ranges.

U.S. Pat. No. 5,472,516 indicates that one can monitor the buildup of impurities in the solution by monitoring the amount of hydrogen peroxide added to the solution as a function of time. This can be attributed to the fact that impurities in the solution stimulate the decomposition of hydrogen peroxide. Since impurities in the solution are undesirable for a clean substrate, the aqueous bath must be exchanged for a fresh bath whenever the concentration of impurities in the solution is too high. A substantial increase in the rate at which the hydrogen peroxide is being added to the solution is an indication that the rate at which hydrogen peroxide is being catalyzed by metal impurities in the solution is much higher than when the bath was fresh. As a result, U.S. Pat. No. 5,472,516 proposes to exchange the aqueous bath for a fresh bath when the rate of adding hydrogen peroxide to the solution exceeds a predetermined level. This technique, however, cannot be used in the technique of "time spiking" since the latter presupposes that the same amount of hydrogen peroxide (and/or the same amount of ammonium hydroxide) is added after fixed time intervals.

JP-A-10326769 discloses a similar feedback loop as does U.S. Pat. No. 5,472,516.

JP-A-08017775 proposes to detect the end of life of an aqueous bath comprising ammonium hydroxide and hydrogen peroxide by monitoring the relationship of the concentration ratio between ammonium hydroxide and hydrogen peroxide.

SUMMARY OF THE INVENTION

An object of the present invention is to provide an arrangement and a method for detecting the end of life of an aqueous bath utilized in semiconductor processing, the bath comprising water, an amount of hydrogen peroxide and an amount of a predetermined chemical species, for instance ammonium hydroxide, wherein the concentrations of hydrogen peroxide and the chemical species are controlled by adding predetermined amounts of at least one of them according to the "spiking" technique.

This object is achieved, in accordance with the invention, by an arrangement for detecting the end of life of an aqueous bath utilized in semiconductor processing, said bath comprising water, an amount of hydrogen peroxide and an amount of a predetermined chemical species, which is either an acid or a base, the arrangement being provided to:
add a predetermined additional amount of the hydrogen peroxide and/or said predetermined chemical species at predetermined time intervals;
measure at least one parameter of the aqueous bath, thereby obtaining a measured parameter value, the at least one parameter being selected from a set of parameters comprising bath pH and bath conductivity;

read a predicted value of the at least one parameter from a memory storing a curve of predicted values of the at least one parameter as a function of time, the curve depending on the predetermined additional amount of said hydrogen peroxide and/or the predetermined chemical species, and depending on the predetermined time intervals;

establish the end of life of said aqueous bath on the basis of a predetermined deviation between said measured parameter value and said predicted value.

By using such an arrangement, no feedback system is required for adding additional amounts of hydrogen peroxide and the predetermined chemical species. The inventors of the present invention have found out that, based on results obtained from simulations carried out by means of similar baths, one can predict the concentration of ammonium hydroxide and hydrogen peroxide present in the bath as a function of time in dependence on the amounts of ammonium hydroxide and hydrogen peroxide spiked into the bath. By monitoring the pH and/or the conductivity of the bath it is possible to obtain an indication of the increase of the impurity concentration within the bath. Curves showing the dependency of the pH and/or the conductivity of the bath, as a function of time, on the added amounts of hydrogen peroxide and/or the predetermined chemical species are stored in a memory of the arrangement. By comparing the measured pH and/or conductivity of the bath with the expected values as shown by the curve concerned, the arrangement can detect where the pH and/or conductivity of the bath starts to deviate significantly from the expected values. At that point, the end of life of the bath is reached.

Thus, for detecting the end of life of the cleaning bath the invention provides for the simple technique of "spiking".

The present invention also provides a method of detecting the end of life of an aqueous bath utilized in semiconductor processing, said bath comprising water, an amount of hydrogen peroxide and an amount of a predetermined chemical species, which is either an acid or a base, the method including the steps of:

adding a predetermined additional amount of the hydrogen peroxide and/or the predetermined chemical species at predetermined time intervals;

measuring at least one parameter of the aqueous bath, thereby obtaining a measured parameter value, the at least one parameter being selected from a set of parameters comprising bath pH and bath conductivity;

reading a predicted value of the at least one parameter from a memory storing a curve of predicted values of the at least one parameter as a function of time, the curve depending on the predetermined additional amount of the hydrogen peroxide and/or the predetermined chemical species, and depending on the predetermined time intervals;

establishing the end of life of the aqueous bath on the basis of a predetermined deviation between said measured parameter value and said predicted value.

BRIEF DESCRIPTION OF THE DRAWING

Below, the invention will be illustrated in detail with reference to one figure showing the arrangement for detecting the end of life of a cleaning bath used for semiconductor processing. The FIGURE shows a vessel 10 comprising an aqueous bath 12 for cleaning substrates, especially semiconductor substrates. However, other substrates like flat panels and photomasks may also be cleaned in the aqueous bath 12.

DESCRIPTION OF THE PREFERRED EMBODIMENTS

The aqueous bath comprises water and at least hydrogen peroxide $H_2O_2$ and a further chemical species. Usually, the further chemical species will be ammonium hydroxide $NH_4OH$. Since the ammonium hydroxide evaporates from the bath and the hydrogen peroxide decomposes as a function of time the concentrations of ammonium hydroxide and hydrogen peroxide will tend to decrease over time. To compensate for this loss, the arrangement is provided with a first pump 6 and a first inlet 2 to input an additional amount of ammonium hydroxide, and a second pump 8 connected to a second inlet 4 to input an additional amount of hydrogen peroxide.

The arrangement also comprises a processor 18, a conductivity measurement unit 14 and a pH measurement unit 16. Both units are connected to the processor 18 to provide the processor with measurement signals regarding the actual conductivity value and the pH value. The processor 18 is also connected to a memory 20 for storing and reading information.

The figure does not show input devices like a mouse and a keyboard, and output devices like a printer or a monitor, which may be connected to the processor 18, as is known to a person skilled in the art. They are not shown in the figure since they are irrelevant to understand the present invention.

Both the ammonium hydroxide and the hydrogen peroxide are added to the aqueous bath 12 in predetermined amounts at predetermined intervals by sending a suitable spiking signal to the pumps 6, 8. In the figure, the situation is shown wherein the processor 18 sends the spiking signal to the pumps 6, 8. However, since the spiking signal is a simple timing signal, the spiking signal can also be generated by a separate timer connected to the pumps 6, 8 but not to the processor 18.

As is known from U.S. Pat. No. 5,472,516, the conductivity value supplied by the conductivity measurement unit 14 to the processor 18 is a measure of the ammonium hydroxide concentration in the aqueous bath 12. Similarly, the pH value as supplied by the pH measurement unit 16 to the processor 18 is a measure of the hydrogen peroxide concentration in the aqueous bath 12.

In the present invention, neither the conductivity value nor the pH value is used to control the pumps 6, 8. As indicated above, the pumps 6, 8 are spiked, i.e., they are controlled to pump additional amounts of ammonium hydroxide and hydrogen peroxide, respectively, to the aqueous bath 12 at predetermined time intervals. In accordance with the invention, the predetermined time intervals are based on test results obtained from simulations carried out by means of similar baths. The inventors of the present invention have found that by using such test results, the pH and the conductivity of the bath, respectively, can be predicted adequately as a function of time since the starting concentrations of ammonium hydroxide and hydrogen peroxide, respectively, are known at the start of the life of the aqueous bath 12. These test results provide a plurality of curves of both the pH and the conductivity as a function of time in dependence on the starting concentrations of ammonium hydroxide (or, alternatively, the starting conductivity value) and hydrogen peroxide (or, alternatively, the starting pH value). These curves are stored in memory 20.

These curves in memory 20 are based on aqueous baths comprising only water, ammonium hydroxide and hydrogen peroxide. However, as is known to a person skilled in the art, during cleaning of substrates in the aqueous bath 12, the concentration of impurities in the aqueous baths increases. This is due to impurities being removed from the substrate surfaces and the presence of undesirable impurities in the chemical species added by the pumps 6, 8. Especially ammonium hydroxide comprises in practice an undesirable amount of Fe. This Fe remains on the substrate surface to be cleaned and catalyses the decomposition of $H_2O_2$ and hence is undesirable. At a certain moment in time, the amount of impurities in the aqueous bath 12 is so high that a substrate can no longer be cleaned to a satisfactory degree.

In accordance with the invention, this moment in time is detected by the processor 18, by detecting whether the conductivity value as supplied by the conductivity measurement unit 14 or the pH value as supplied by the pH measurement unit 16 deviates too much from the expected value. Whether or not the conductivity value and/or the pH value deviates too much from the expected value is determined by the processor 18 by comparing these values with the relevant curves in memory 20. These curves provide the processor with the conductivity value and the pH value to be expected as a function of time, as explained above.

Preferably, the processor 18 detects the end of life of the aqueous bath 12 when the conductivity value and/or the pH value deviates from, respectively, the expected conductivity value and the expected pH value by 20%. However, it is to be noted that this level of 20% is not critical. Another percentage of deviation from the expected value(s) may be chosen.

Alternatively, a deviation of the first or higher time derivative of the pH value or the conductivity value from the expected value of such a first or higher time derivative may be used as a criterion of the end of life.

The aqueous bath 12 described above comprises water, ammonium hydroxide and hydrogen peroxide, and thus the aqueous bath 12 is a so-called SC1-bath. However, the invention is not limited to such a bath only. The invention is applicable to any aqueous cleaning bath where the conductivity value and/or the pH value can be used as an indication of the concentration of the chemical species used. In practice, the aqueous bath will comprise hydrogen peroxide and a second chemical species. A second chemical species may be for instance either ammonium hydroxide as explained above, hydrochloric acid (SC2 solution), NaOH, KOH, $H_2SO_4$, $H_3PO_4$, or HF.

In addition to the method described above, the aqueous bath 12 may comprise a complexing species, which combines with the impurities in the aqueous bath 12 and is chosen such that it does not remain on the surface of the substrate to be cleaned. One such complexing species may be diethylene triamine penta(methylene phosphonic acid) which combines with Fe. During use of the bath, the concentration of impurities, inter alia Fe, will increase. However, as long as an amount of the complexing species is still present in the aqueous bath 12, it will combine with Fe. Thus, the aqueous bath 12 acts as if it is pure and the pH value and the expected conductivity value will follow the expected pH value and the conductivity value, respectively, as shown by the curves stored in memory 20. As soon as all complexing species in the aqueous bath 12 is combined with the impurities (Fe), the impurities (Fe) will remain uncombined in the bath. In case the Fe concentration then suddenly increases, the hydrogen peroxide starts to decompose faster. This results in a sudden deviation of the pH value and/or conductivity value, measured by the pH measurement unit 16 and the conductivity measurement unit 14, respectively. After having detected such a sudden deviation of the pH value and/or conductivity value a warning signal will be generated by processor 18. Such a warning signal may be used to warn the operator to discontinue the use of bath 12 or to automatically stop the use of bath 12.

Actually, the processor 18 will then check whether the first time derivative of the pH and/or the conductivity shows a sudden change, e.g., a change by 10% or more.

In one practical embodiment, it is sufficient to add such a small amount of complexing species to a fresh bath (i.e. at the beginning of its use) that it will combine with a few, e.g. 1–10, ppb Fe. Above, it is stated that both conductivity and pH can be used in the arrangement and the method according to the invention. However, it is preferred to measure the conductivity only since measuring the conductivity can be done in a contact-free manner.

What is claimed is:

1. Arrangement for detecting the end of life of an aqueous bath utilized in semiconductor processing, said bath comprising water, an amount of hydrogen peroxide and an amount of a predetermined chemical species, which is either an acid or a base, the arrangement being provided to:

a plurality of pumps for adding a predetermined additional amount of said hydrogen peroxide and/or said predetermined chemical species at predetermined time intervals;

a conductivity measurement unit and a pH measurement unit, wherein both said units coupled to a processor which measures at least one parameter of the aqueous bath, thereby obtaining a measured parameter value, said at least one parameter being selected from a set of parameters comprising bath pH and bath conductivity;

a timer generates a timing signal coupled to said plurality of pumps, and not coupled to said processor;

the processor reads a predicted value of said at least one parameter from a memory coupled to said processor for storing a curve of predicted values of said at least one parameter as a function of time, said curve depending on said predetermined additional amount of said hydrogen peroxide and/or said predetermined chemical species, and depending on said predetermined time intervals;

the processor establishes the end of life of said aqueous bath on the basis of a predetermined deviation between said measured parameter value and said predicted value.

2. Arrangement according to claim 1, wherein said chemical species is ammonium hydroxide.

3. Arrangement according to claim 1, wherein said aqueous bath also comprises a predetermined complexing species to combine with impurities present in the aqueous bath.

4. Arrangement according to claim 1, wherein said predetermined deviation is a predetermined difference between said measured parameter value and said predicted value.

5. Arrangement according to claim 4, wherein said predetermined difference is 20% of the predicted value.

6. Arrangement according claim 1, wherein said predetermined deviation is a predetermined difference between the first time derivative of the measured parameter value and the first time derivative of the predicted value.

7. Method of detecting the end of life of an aqueous bath utilized in semiconductor processing, said bath comprising water, an amount of hydrogen peroxide and an amount of a predetermined chemical species, which is either an acid or a base, the method including the steps of:

adding a predetermined additional amount of said hydrogen peroxide and/or said predetermined chemical species at predetermined time intervals;

measuring at least one parameter of the aqueous bath, thereby obtaining a measured parameter value, said at least one parameter being selected from a set of parameters comprising bath pH and bath conductivity;

reading a predicted value of said at least one parameter from a memory storing a curve of predicted values of said at least one parameter as a function of time, said curve depending on said predetermined additional amount of said hydrogen peroxide and/or said predetermined chemical species, and depending on said predetermined time intervals;

establishing the end of life of said aqueous bath on the basis of a predetermined deviation between said measured parameter value and said predicted value using a processor.

8. Method according to claim 7, wherein said chemical species is ammonium hydroxide.

9. Method according to claim 7, wherein said aqueous bath also comprises a predetermined complexing species to combine with impurities present in the aqueous bath.

10. Method according to claim 7, wherein said predetermined deviation is a predetermined difference between said measured parameter value and said predicted value.

11. Method according to claim 10, wherein said predetermined difference is 20% of the predicted value.

12. Method according to any of the claims 7, wherein said predetermined deviation is a predetermined difference between the first time derivative of the measured parameter value and the first time derivative of the predicted value.

13. Method of manufacturing a semiconductor device making use of the method as claimed claim 7.

* * * * *